US011836171B2

(12) United States Patent
Seshadri

(10) Patent No.: US 11,836,171 B2
(45) Date of Patent: Dec. 5, 2023

(54) DEMAND BASED DYNAMIC CREATION OF DATA ANALYTICS QUERY ACCELERATORS

(71) Applicant: Google LLC, Mountain View, CA (US)

(72) Inventor: Kiran Kalkunte Seshadri, Austin, TX (US)

(73) Assignee: Google LLC, Mountain View, CA (US)

( * ) Notice: Subject to any disclaimer, the term of this patent is extended or adjusted under 35 U.S.C. 154(b) by 84 days.

(21) Appl. No.: 17/502,793

(22) Filed: Oct. 15, 2021

(65) Prior Publication Data

US 2022/0156293 A1 May 19, 2022

Related U.S. Application Data

(60) Provisional application No. 63/113,273, filed on Nov. 13, 2020.

(51) Int. Cl.
| | |
|---|---|
| *G06F 16/2453* | (2019.01) |
| *G06F 16/33* | (2019.01) |
| *H03K 19/17752* | (2020.01) |
| *G06F 16/338* | (2019.01) |
| *G06F 16/335* | (2019.01) |
| *G06F 15/78* | (2006.01) |

(52) U.S. Cl.
CPC ........ *G06F 16/334* (2019.01); *G06F 15/7867* (2013.01); *G06F 16/335* (2019.01); *G06F 16/338* (2019.01); *H03K 19/17752* (2013.01)

(58) Field of Classification Search
CPC .. G06F 15/7867; G06F 16/334; G06F 16/335; G06F 16/338; H03K 19/17752
See application file for complete search history.

(56) References Cited

U.S. PATENT DOCUMENTS

| | | | |
|---|---|---|---|
| 10,691,580 B1* | 6/2020 | Kasat | G06F 11/364 |
| 2019/0138739 A1* | 5/2019 | Hu | G06F 16/2455 |
| 2020/0183937 A1* | 6/2020 | Verma | G06F 16/24568 |
| 2020/0301898 A1* | 9/2020 | Samynathan | G06F 16/2453 |
| 2021/0081215 A1* | 3/2021 | Schultz | G06F 11/0751 |

OTHER PUBLICATIONS

Wikipedia. Field-programmable gate array. Oct. 22, 2019. 16 pages. Retrieved from the Internet: < https://en. wikipedia.org/w/index. php?title=Field-programmable_gate_array&oldid=922531226>.
Athanas et al. Embedded Systems Design with FPGAs. 2013. Springer, 281 pages.
Vipin et al. FPGA Dynamic and Partial Reconfiguration: A Survey of Architectures, Methods, and Applications. Jul. 25, 2018. ACM Computing Surveys, ACM, New York, NY, US, vol. 51, No. 4, pp. 1-39.
International Search Report and Written Opinion for International Application No. PCT/US2021/059126 dated Apr. 7, 2022. 14 pages.

* cited by examiner

*Primary Examiner* — Kurtis R Bahr
(74) *Attorney, Agent, or Firm* — Lerner David LLP

(57) ABSTRACT

A system and method for processing queries including splitting a query into sub-queries, mapping the sub-queries to respective sets of filter properties, mapping the sets of filter properties to respective reconfiguration bitstreams, configuring a plurality of filters within a field programmable gate array (FPGA) according to respective ones of the respective reconfiguration bitstreams, wherein each filter is formed in a respective reconfigurable region of the FPGA.

20 Claims, 4 Drawing Sheets

US 11,836,171 B2

DEMAND BASED DYNAMIC CREATION OF DATA ANALYTICS QUERY ACCELERATORS

CROSS-REFERENCE TO RELATED APPLICATIONS

The present application claims the benefit of the filing date of U.S. Provisional Application No. 63/113,273, filed on Nov. 13, 2020, the disclosure of which is hereby incorporated herein by reference.

BACKGROUND

Computer systems and networks can be adapted to particular tasks through the use of reconfigurable architectures. One type of reconfigurable architecture is a dynamic field-programmable gate array (FPGA). In a dynamic FPGA the logic components, such as look-up-tables (LUTs), complex programmable logic devices (CPLDs), flip flops (FFs) and routing channels of a region of the FPGA can be dynamically reconfigured during runtime. The region may contain one or more physical regions of the FPGA. Thus, to enable reconfiguration, the FPGA is split into a static region and one or more reconfigurable regions. The reconfigurable regions are reconfigured using reconfiguration bitstreams that are used in conjunction with FPGA hardware primitives. Reconfiguration bitstreams contain the configuration of the reconfigurable regions' logic components.

BRIEF SUMMARY

It has been recognized that a dynamic FPGA can be employed to increase the speed and efficiency of data queries. A particular focus is data queries directed to big databases. Big databases are typically organized in a columnar fashion and have tables made up of rows and columns. Columnar databases are databases where columns of the database, which contain multiple rows, are stored in contiguous memory, on a disk, in a solid state drive (SSD) or some other type of memory. Data sets of a columnar database may be made up of tuples. Each tuple can be thought of as a unit of data. For example, a column can be a column of names. Each name can have 64 ASCII characters (American Standard Code for Information Interchange characters). In such case, a name is a tuple, and the tuple size is 64 bytes, assuming each ASCII character is 1 byte.

In view of the growing demand to run queries on large databases, such as columnar databases, the present technology is provided. The technology concerns dynamically generating a data analytics query accelerator on a central processing unit (CPU) that is connected to an FPGA by mapping queries to dynamically reconfigurable and pre-implemented specialized programmable hardware blocks of the FPGA. The hardware blocks are called filters. These filters are dynamically reconfigured into the FPGA, setup as required and are used to run queries on the customer data sets and provide filtered outputs.

In one aspect, the technology provides a query accelerator. The query accelerator includes a plurality of reconfigurable regions; and a static region including a controller operable to receive a plurality of reconfiguration bitstreams respectively corresponding to the reconfigurable regions, the reconfiguration bitstreams specifying formation of respective filters in the reconfigurable regions, each filter including one or more registers for controlling and monitoring operation of the filter, a memory for temporary storage in the filter, filter logic, an input stream interface for receiving data to be filtered, a filtered output stream interface for providing a result of operation of the filter, and a plurality of partition pins having fixed physical locations and providing interfaces between the reconfigurable region of the filter and the static region.

In another aspect, the technology provides a method for processing queries. The method includes splitting a query into sub-queries; mapping the sub-queries to respective sets of filter properties; mapping the sets of filter properties to respective reconfiguration bitstreams; and configuring a plurality of filters within a field programmable gate array (FPGA) according to respective ones of the respective reconfiguration bitstreams, wherein each filter is formed in a respective reconfigurable region of the FPGA.

In still another aspect, the technology provides a system for processing queries. The system includes a driver for receiving a query and for controlling splitting the query into a plurality of sub-queries, mapping the sub-queries to respective sets of filter properties and mapping the sets of filter properties to respective reconfiguration bitstreams, generating an accelerator generation recipe based on the mapping of the sub-queries and the mapping of the sets of filter properties, and accessing one or more control status registers (CSRs) based on the accelerator generation recipe; and a query accelerator including a plurality of reconfigurable regions, a static region including a controller operable to receive one or more control status register (CSR) values from the driver and acquire the plurality of reconfiguration bitstreams based on the received CSR values, the reconfiguration bitstreams respectively corresponding to the reconfigurable regions, and the reconfiguration bitstreams specifying formation of respective filters in the reconfigurable regions, each filter including one or more registers for controlling and monitoring operation of the filter, a memory for temporary storage in the filter, filter logic, an input stream interface for receiving data to be filtered, a filtered output stream interface for providing a result of operation of the filter, and a plurality of partition pins having fixed physical locations and providing interfaces between the reconfigurable region of the filter and the static region.

BRIEF DESCRIPTION OF THE DRAWINGS

The accompanying drawings are not intended to be drawn to scale. Also, for purposes of clarity not every component may be labeled in every drawing. In the drawings.

DETAILED DESCRIPTION

Examples of systems and methods are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. In the following description, reference is made to the accompanying figures, which form a part thereof. In the figures, similar symbols typically identify similar components, unless context dictates otherwise. Other embodiments may be utilized, and other changes may be made, without departing from the spirit or scope of the subject matter presented herein.

The example embodiments described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

Figure 1:
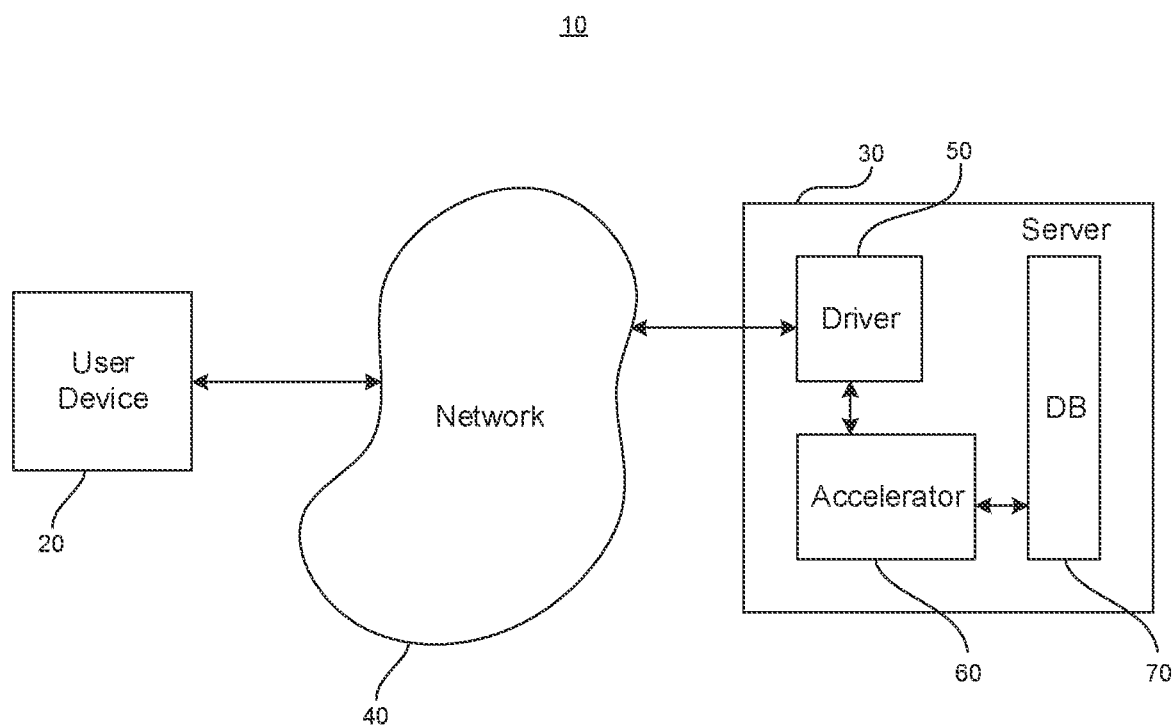
FIG. 1 is a schematic diagram illustrating how a query accelerator of the disclosure may be implemented in a computer system network.

FIG. 1 is a schematic diagram illustrating how a query accelerator of the disclosure may be implemented in a computer network system 10. As can be seen from the figure, the computer system network 10 may include a user device 20, a server 30, and a network 40. In an example of an embodiment, the user device 20 may take the form of a desktop computer, a laptop computer, a notebook computer, a tablet computer, a mobile phone, but is not limited to such forms. Further, network 40 may be the Internet, and server 30 may be a web server that stores a server log 40 which services requests, such as data queries, made over the network 40 through user device 20. The server includes a driver 50 for receiving queries received via the network 40, a query accelerator 60 communicatively coupled to the driver 50, and a database 70. The driver 50 may take the form of a CPU and the query accelerator may take the form of a dynamic FPGA. The driver 50 and query accelerator 60 may work in combination to process data queries directed to data stored in the database 70.

Regarding the user device 20 and server 30, it should be noted that each such elements are not limited to a single device or a single location. That is, each such element may take the form of several devices, and those devices may or may not be geographically dispersed. Each of the elements is depicted as singular only for the sake of brevity of description and should not be limited to being embodied by a single device or at a single location. For example, sever 30 may be implemented in the cloud, and as such, may be made up of software that runs on a multiple of platforms.

Regarding the database 70, it should be noted that the database depicted in FIG. 1 is used by way of example. Indeed, the database may be external to the server 30, may be stored in a different server, may be stored in a different type of device, or may be stored in a combination of servers or devices. For example, the database may be provided in one or more general purpose computers, personal computers, mobile devices such as a smart phone or a tablet, wearable devices such as watches or glasses, environmental sensors or controllers, or personal sensors such as sensors for health monitoring or alerting, cars or other vehicles such as self-driving cars or drones or other airborne vehicles. Further, the database may be stored via a platform as a service, or via an infrastructure as a service.

In addition, it should be noted that network 40 is not limited to a single network and may include a multiple of inter-connected networks. Moreover, some embodiments do not include a network. For example, the user device may be directly connected to the server 30.

For sake of conciseness, the embodiment depicted in FIG. 1 will serve as the basis for much of the present disclosure.

In an embodiment like that depicted in FIG. 1, a user of user device 20 initiates a query of data contained in database 70. The query is transmitted over network 40 to server 30, where it is received by driver 50. The driver 50 processes the query in combination with query accelerator 60 to generate a query response based on analysis of the data stored in database 70. The query response may be transmitted to the user device 20 via network 40 and presented to the user at the user device 20.

The query accelerator 60 allows for rapid processing of queries. For example, using the query accelerator 60 with the driver 50 in the FIG. 1 embodiment allows a query to be processed faster than the speed at which the query could be processed in the FIG. 1 embodiment with only the driver 50, that is faster than the query could be processed in the FIG. 1 embodiment absent the query accelerator 60. The query accelerator 60 may be implemented by an FPGA.

Figure 2:
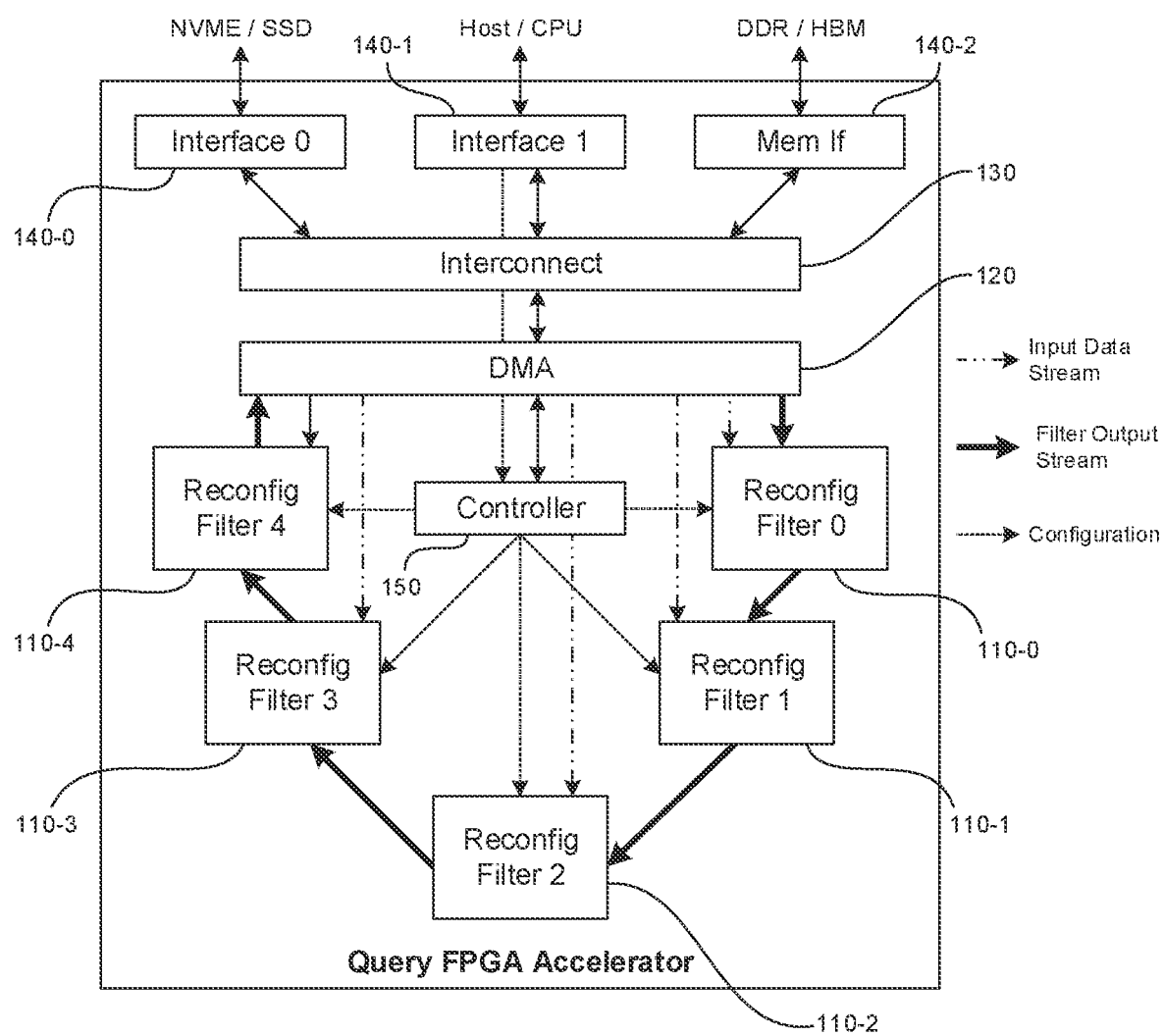
FIG. 2 is a block diagram of an FPGA query accelerator according to the disclosure.

FIG. 2 is a block diagram of an FPGA query accelerator 100 according to the disclosure. The query accelerator 100 is a FPGA based hardware accelerator to accelerate queries on huge data sets. The query accelerator 100 contains one or more specialized programmable hardware filters that can be configured to filter data from huge data sets that are streamed into the query accelerator 100 from various data sources. The interconnected filters, along with static components, make up the full query accelerator 100. The query accelerator 100 has the following components 1) Reconfigurable filter regions 110-0, 110-1, 110-2, 110-3, and 110-4—These are logic regions of the FPGA that can be dynamically (at runtime) reconfigured. The logic intended to be reconfigured is one of the specialized filters that perform a specific operation on an input stream. In the embodiment of FIG. 2, the reconfigurable filter regions 110-0, 110-1, 110-2, 110-3, and 110-4 correspond on a one-to-one basis with filters, and therefore the reconfigurable regions and the filters will be referred to by the same reference numbers. Nevertheless, it should be noted that it is not necessary to have a one-to-one correspondence between reconfigurable filter regions and filters. For example, it is possible for a filter be realized by a more than one reconfigurable filter region, or for more than one filter to be realized by a single reconfigurable filter region. Moreover, it is not necessary that there be five reconfigurable regions or five filters. There may be one or more reconfigurable regions or one or more filters.

2) Filters 110-0, 110-1, 110-2, 110-3, and 110-4—These are pre-implemented hardware components that perform programmable/configurable specialized operations on an input stream using one or more operands. The filters 110-0, 110-1, 110-2, 110-3, and 110-4 are described in greater detail below.

3) Direct Memory Access (DMA) engine(s) 120—Used to move data from various sources into the filters 110-0 to 110-4, or to move data from the filters 110-0 to 110-4 to various sinks.

4) Interconnect 130—On-FPGA interconnect/Network-on-chip to provide connectivity between various data sources and sinks 5) Interfaces 140-0, 140-1, and 140-2—These are interfaces of the FPGA to the external world where data is read from or written to. These may include a host interface 140-1 which may couple to a CPU (e.g., driver 50), via PCIE (Peripheral Component Interconnect Express), off-chip memory interface 140-2, such as a DDR/HBW (Double Data Rate/High Bandwidth Memory) interface, and a storage interface 140-0, such as a NVME/SSD (Non Volatile Memory Express/Solid State Drive) interface. One of these interfaces, typically the host interface 140-1, is also used to receive configuration data like filter configuration, filter reconfiguration bitstream etc. Notably, the interfaces are not limited to the interfaces shown in FIG. 2. The interfaces may include more or fewer than three interfaces, and may include interfaces of types other than the types shown in FIG. 2.

6) Controller 150—The controller 150 may have the following functions
   a) Enable the creation and control of the query accelerator 100 by providing Filter reconfiguration CSRs (Control Status Registers) and FSMs (Finite State Machines) for filter region reconfiguration. The Filter reconfiguration CSRs and FSMs may
      i) Control interface isolation between the static components and the reconfigurable regions. In the FIG. 2 embodiment, the static components include DMA 120, interconnect 130, interfaces 140-0, 140-1, and 140-2, and controller 150.
      ii) Start DMA accesses to fetch reconfiguration bitstreams from an external source, such as Host DRAM (Dynamic Random Access Memory), that are used to reconfigure filter regions.
      iii) Route the reconfiguration bitstreams to appropriate regions.
      iv) Enable reset and setup functionality for the reconfigured filters. Reset may be a setting of all the internal states of the hardware components inside the filter. For example, if the filter includes registers/memories/state machines/counters etc., reset may put all such elements into a "known" state. Setup may be a providing of input values to the filter. For example, if the filter is a string filter setup may include providing the filter with a string to look for in a to-be-filtered data stream.
   b) Provide the logic to route the config CSR accesses from the host to the appropriate filters to setup the filters 110-0 to 110-4 to perform the desired functions.

Each of filters 110-0 to 110-4 is a specialized hardware block intended to be dynamically reconfigured into predetermined regions of the FPGA. Each of filters 110-0 to 110-4 will provide specific functionality used for running part of a query. For example, the filter types include
   1) A regular expression filter, which provides functionality to run a regular expression match on every tuple of a data set.
   2) A floating point filter, which provides functionality to identify all tuples of a data set that are between two values given values.
   3) A string filter, which provides functionality to identify all tuples of a data set that match a given string.
   4) An aggregation filter, which will compute minimum or maximum or count matched values etc. on the output of a filter.

For a given reconfigurable region, multiple filter types are designed and implemented (placed, routed, and bitstream generated). During runtime, based on a query, one of the filter types is chosen for the reconfigurable region. The bitstream for the chosen filter type is applied to the region so as to configure the region according to the chosen filter type. The resulting filter is then setup with appropriate operand values and configuration parameters to obtain a desired filter functionality. Since the configuration of the reconfigurable region may involve changing a previous configuration of the region, the bitstream may be called a reconfiguration bitstream and the configuration may be called a reconfiguration.

A reconfiguration bitstream details a configuration of hardware components of the FPGA. The FPGA's hardware components may include logical components, such as Lookup tables, memories, etc., and routing components, and the reconfiguration bitstream may specify a function for each Lookup table and connections between Lookup tables. For instance, the reconfiguration bitstream may specify that that a first lookup table (LUT0) implements an AND gate, a second lookup table (LUT1) implements an OR gate, and a third lookup table (LUT2) implements an XOR gate, and that the output of LUT0 and LUT1 are connected to the input of LUT2. More generally, reconfiguration bitstreams contain configuration information for implementing logical circuits using FPGA resources, with different kinds of logical circuits corresponding to different reconfiguration bitstreams. Moreover, the reconfiguration bitstreams may be generated using FPGA vendor provided tools, which can generate a reconfiguration bitstream for a logic circuit based on a high-level description of the circuit.

Figure 3:
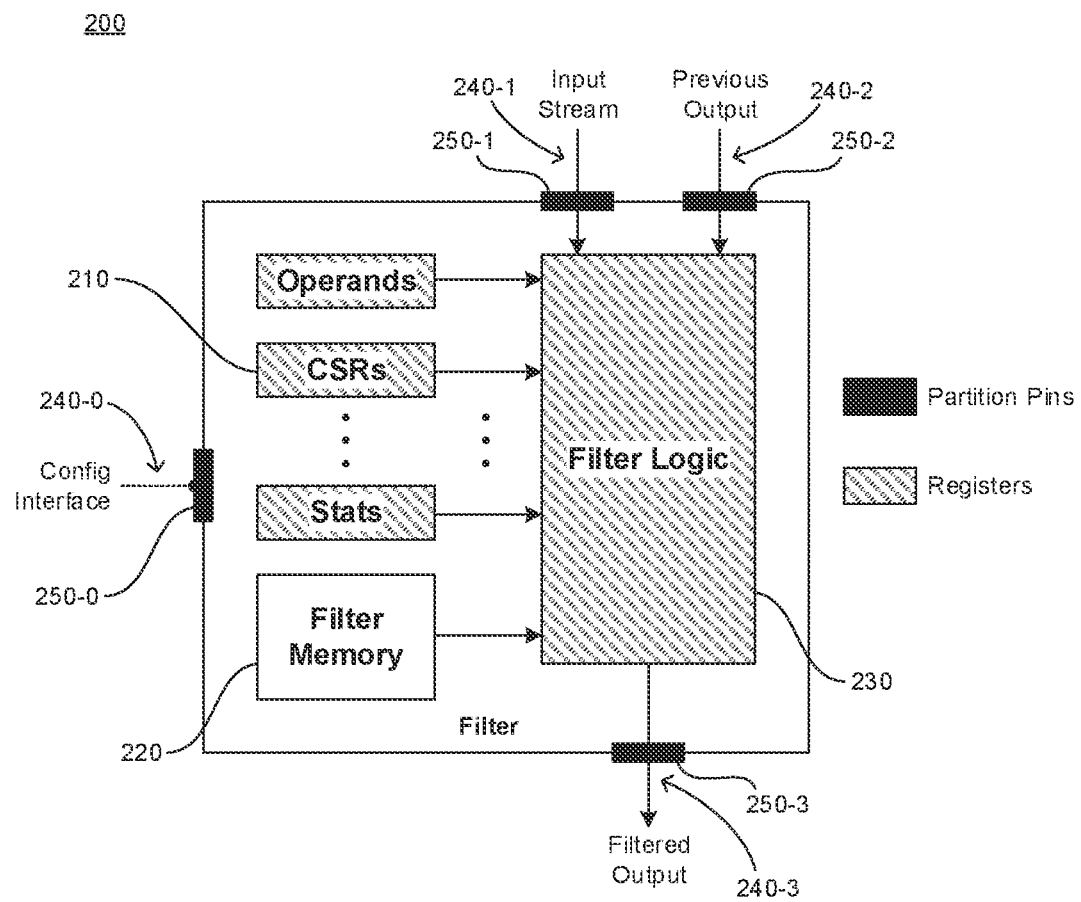
FIG. 3 is a block diagram of a filter according to the disclosure.

FIG. 3 is a block diagram of a filter 200 according to one embodiment. As can be seen from the figure, in the embodiment every filter has the following components
   1) Config and Status registers 210 for operands, control bits and other configuration parameters to control and monitor the operation of the filter 200.
   2) Filter memory 220, such as block RAMs (Random Access Memories), used for temporary storage by the filter 200.
   3) Filter logic 230 that provides the main functionality of the filter 200.
   4) Interfaces 240-0, 240-1, 240-2, and 240-3
      a) Input Stream Interface 240-1 for receiving data to be filtered, e.g., column data.
      b) Previous Result Stream Interface 240-2 for receiving the results of previous filter operation, e.g., a flag and a value for a previously matched tuple.
      c) Filtered Output Stream Interface 240-3 for providing the result of the current filter operation, e.g., a flag and a value of a matched tuple.
      d) Configuration Interface 240-0 for receiving CSR writes and reads from a controller, e.g., controller 150, and providing responses to the writes and reads.

The Interfaces 240-0, 240-1, 240-2, and 240-3 are associated with respective partition pins 250-0, 250-1, 250-2, and 250-3. The partition pins 250-0 to 250-3 are special pins provided by the FPGA 100 for the interfaces/nets between the static logic and reconfigurable filters. These pins are fixed and cannot change across different filters. All filters being targeted for a particular reconfigurable region should have the same ports and also same physical locations for partition pins.

In an embodiment, the filters for a query are generated according to an accelerator generation recipe. The accelerator generation recipe may be automatically generated by the driver 50 in response to receipt of a query at the driver 50, and may take the form of a CSV (Comma-Separated Values) file or JSON (JavaScript Object Notation) file, although other forms will be readily apparent to one skilled in the art upon review of this disclosure.

In the embodiment of FIG. 1, the accelerator generation recipe is used to generate the query accelerator, e.g., query accelerator 60 or query accelerator 100, for a query, e.g., a customer query from user device 20. The accelerator generation recipe is the bridge between the query and the query accelerator 60 or 100 and therefore contains all the information required to make up every reconfigurable region. For example, for each reconfigurable region the accelerator generation recipe specifies a. Filter type
b. Filter bitstream source address/file handle
c. Filter bring up sequences—sets of steps for making the reconfigurable region ready to receive data, for example, steps for setting of all the internal states of the hardware components inside the filter (i.e., steps for reset) and steps for providing input values to the filter (i.e., steps for setup).
d. Filter configuration registers, tuple types, operand types, operands and configuration parameters—an example of a configuration register is a register of a string filter which holds a string to be searched-for, the string to be searched-for being a configuration parameter In addition to the accelerator generation recipe, the driver may generate an operation recipe. The operation recipe contains the information about the data, namely the source address(es) of the data to be input to the query accelerator and the destination address(es) of the filtered data to be output from the query accelerator.

An illustrative operation flow according to the present technology is as follows
1) Algorithmically split a query into sub-queries.
2) Map each sub-query to a filter type and the required filter configuration parameters.
3) Create a recipe for generating the query accelerator. This includes the filter type and filter configuration and the reconfiguration bitstream addresses for every reconfigurable region of the query accelerator.
4) Using the recipe, send CSR accesses to the controller to start the reconfiguration FSM and provide it information from the recipe.
5) Controller reconfiguration FSM will start DMA accesses to fetch reconfiguration bitstreams. After reconfiguration bitstreams are available, use FPGA primitives to reconfigure the required regions.
6) After the regions are reconfigured, the controller will wait for the filter to come out of reset and get ready for setup.
7) Controller will setup the filter configuration parameters like the operands, control bits, memories etc. to enable desired functioning of the filter.
8) Controller will setup DMA descriptors to start DMA accesses to fetch the tuples from the data sets that require filtering. Tuples are fed in as a stream into the filter.
9) Controller will setup DMA descriptors for output filtered data to be written back to the desired destination like host/external memory.

Figure 4:
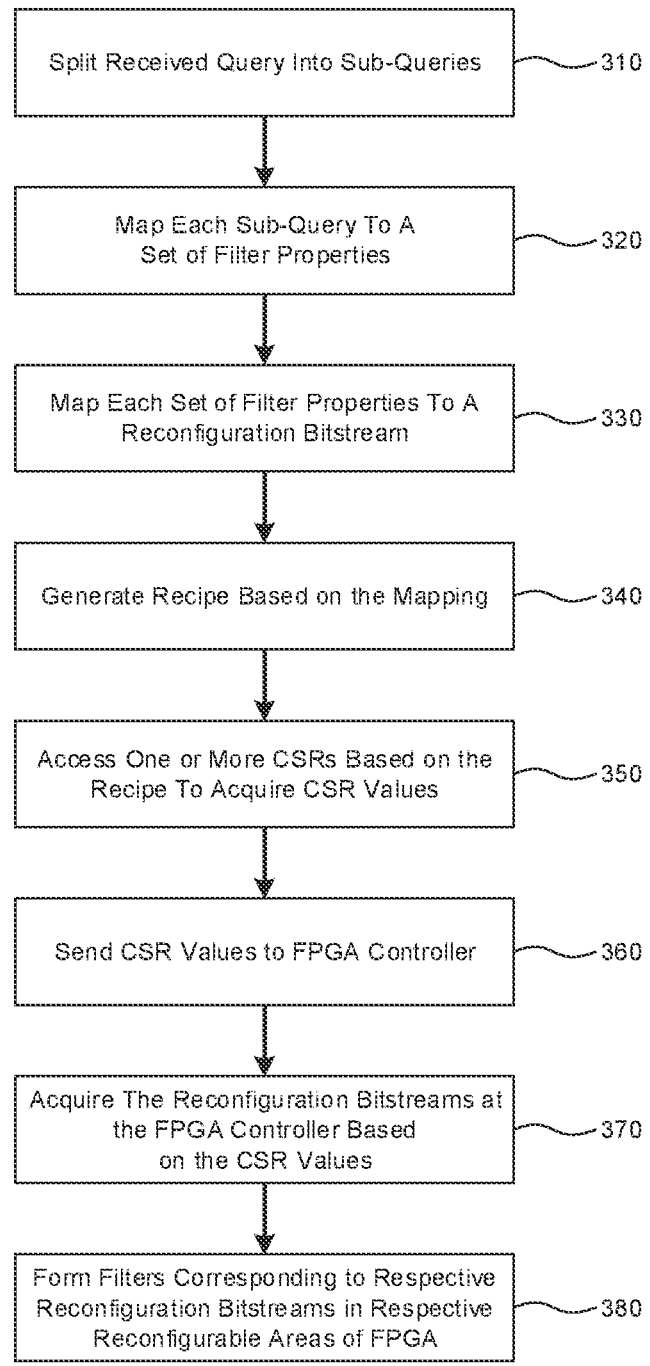
FIG. 4 is a flow chart depicting an operation of an embodiment for configuring an FPGA based on a query.

FIG. 4 is a flow chart depicting an operation of an embodiment for configuring an FPGA, such as FPGA 100, based on a query. The operation may be performed, for example, by server 30. The operation may begin when a received query, e.g., a query received by driver 50, is split into a multiple of sub-queries (step 310). The sub-queries are then mapped to respective sets of filter properties (step 320) and the sets of filter properties are, in turn, mapped to respective reconfiguration bitstreams (step 330). The reconfiguration bitstream for a set of filter properties may be generated at a time prior to the mapping and stored for later retrieval. For instance, the reconfiguration bitstream may be generated prior to receipt of the query or generated when the corresponding sub-query is mapped to a set of filter properties.

Next, an accelerator generation recipe is generated based on the mapping of the sub-queries and the mapping of the sets of filter properties (step 340), the recipe including reconfiguration bitstream addresses for respective ones of the reconfiguration bitstreams. The recipe is then used to access one or more CSRs, e.g., CSRs of driver 50, and acquire CSR values (step 350). The values are sent to the FPGA controller, e.g., to controller 150 from driver 50 (step 360). The controller then uses the CSR values to acquire the reconfiguration bitstreams (step 370), and uses the reconfiguration bitstreams to form filters, e.g., filters 110-0 to 110-4, corresponding to respective ones of the reconfiguration bitstreams (step 380).

An example of query processing according to an embodiment is now described in reference to a hypothetical query of a customer data set. The hypothetical query is: find all persons that have the last name "Smith" and are between ages 30 and 40, and provide a count of the number of persons that matched this query.

As a first step the hypothetical query is split into three sub-queries, a string sub-query, an integer sub-query, and an aggregation sub-query. Next, the sub-queries are mapped to filters as follows
1) Filter 110-0—String filter—The input to the filter 110-0 is a "Name" column of the dataset. The tuple type for the filter is "String". The filter 110-0 is configured to find all tuples in the Name column with string matching "Smith". The output of the filter 110-0 is a flag that denotes a match and the value of the matched tuple (name of the person).
2) Filter 110-1—Integer filter—The input to the filter 110-1 is an "Age" column of the dataset. The tuple type for the filter 110-1 is "Integer". An input to the filter 110-1 is the output of filter 110-0, namely a flag that denotes when the previous filter had a match and the value of the match. Filter 110-1 configured to find all tuples with number between 30 and 40 for values received from filter 110-0. The output of filter 110-1 is a flag that denotes a match and the value of the matching one the incoming tuples (name of the person)
3) Filter 110-2 and 110-3—Bypass
4) Filter 110-4—Aggregation filter—The input to filter 110-4 is the flag denoting a match from filter 110-1 and the value of the tuple that matched (name of the person). Filter 110-4 is configured to count the number of matches. The output of filter 110-4 is the values of all the tuples output from filter 110-1 and total number of tuples output from filter 110-1.

Embodiments of the present technology include, but are not restricted to, the following.

(1) A query accelerator including a plurality of reconfigurable regions; and a static region including a controller operable to receive a plurality of reconfiguration bitstreams respectively corresponding to the reconfigurable regions, the reconfiguration bitstreams specifying formation of respective filters in the reconfigurable regions, each filter including one or more registers for controlling and monitoring operation of the filter, a memory for temporary storage in the filter, filter logic, an input stream interface for receiving data to be filtered, a filtered output stream interface for providing a result of operation of the filter, and a plurality of partition pins having fixed physical locations and providing interfaces between the reconfigurable region of the filter and the static region.

(2) The query accelerator according to (1), wherein one or more of the filters further includes a previous result stream interface for receiving results previously generated by another filter.

(3) The query accelerator according to (1), wherein the controller is operable to receive the plurality of reconfiguration bitstreams by receiving respective reconfiguration bitstream addresses and acquires the reconfiguration bitstreams according to the reconfiguration bitstream addresses.

(4) The query accelerator according to (1), further including a direct memory access (DMA) engine for at least one of moving data to the filters and moving data from the filters.

(5) The query accelerator according to (1), wherein the reconfigurable regions and the static region are included in a field programmable gate array (FPGA).

(6) The query accelerator according to (1), wherein each reconfiguration bitstream specifies a filter type and one or more operand types.

(7) A method for processing queries including splitting a query into sub-queries; mapping the sub-queries to respective sets of filter properties; mapping the sets of filter properties to respective reconfiguration bitstreams; and configuring a plurality of filters within a field programmable gate array (FPGA) according to respective ones of the respective reconfiguration bitstreams, wherein each filter is formed in a respective reconfigurable region of the FPGA.

(8) The method according to (7), wherein each reconfiguration bitstream specifies a filter type and one or more operand types.

(9) The method according to (7), wherein each filter includes one or more registers for controlling and monitoring operation of the filter, a memory for temporary storage in the filter, filter logic, an input stream interface for receiving data to be filtered, a filtered output stream interface for providing a result of operation of the filter, and a plurality of partition pins having fixed physical locations and providing interfaces between the reconfigurable region of the filter and a static region of the FPGA.

(10) The method according to (7), further including sending one or more control status register (CSR) values to a controller of the FPGA to initiate configuration of the filters.

(11) The method according to (10), further including generating an accelerator generation recipe based on the mapping of the sub-queries and the mapping of the sets of filter properties, the recipe including reconfiguration bitstream addresses for respective ones of the reconfiguration bitstreams, wherein the sending of the CSR values to the controller is performed according to the accelerator generation recipe and includes sending the reconfiguration bitstream addresses to the controller, and wherein the controller performs direct memory accesses to acquire the reconfiguration bitstreams according to the reconfiguration bitstream addresses.

(12) The method according to (7), wherein the mapping the sub-queries includes detecting whether the query requires string matching.

(13) The method according to (12), wherein when there is a detection that the query requires string matching, the step of mapping the sets of filter properties to respective reconfiguration bitstreams includes mapping at least one of the sets of filter properties to a reconfiguration bitstream for a string filter.

(14) A system for processing queries including a driver for receiving a query and for controlling splitting the query into a plurality of sub-queries, mapping the sub-queries to respective sets of filter properties and mapping the sets of filter properties to respective reconfiguration bitstreams, generating an accelerator generation recipe based on the mapping of the sub-queries and the mapping of the sets of filter properties, and accessing one or more control status registers (CSRs) based on the accelerator generation recipe; and a query accelerator including a plurality of reconfigurable regions, a static region including a controller operable to receive one or more control status register (CSR) values from the driver and acquire the plurality of reconfiguration bitstreams based on the received CSR values, the reconfiguration bitstreams respectively corresponding to the reconfigurable regions, and the reconfiguration bitstreams specifying formation of respective filters in the reconfigurable regions, each filter including one or more registers for controlling and monitoring operation of the filter, a memory for temporary storage in the filter, filter logic, an input stream interface for receiving data to be filtered, a filtered output stream interface for providing a result of operation of the filter, and a plurality of partition pins having fixed physical locations and providing interfaces between the reconfigurable region of the filter and the static region.

(15) The system according to (14), wherein one or more of the filters further includes a previous result stream interface for receiving results previously generated by another filter.

(16) The system according to (14), wherein the controller is operable to receive the plurality of reconfiguration bitstreams by receiving respective reconfiguration bitstream addresses and acquires the reconfiguration bitstreams according to the reconfiguration bitstream addresses.

(17) The system according to (14), wherein the query accelerator further includes a direct memory access (DMA) engine for at least one of moving data to the filters and moving data from the filters.

(18) The system according to (14) wherein the reconfigurable regions and the static region are included in a field programmable gate array (FPGA).

(19) The system according to (14), wherein each reconfiguration bitstream specifies a filter type and one or more operand types.

(20) The system according to (14), wherein the driver and query accelerator are included in a server.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims.

The invention claimed is:

1. A query accelerator comprising:
a plurality of reconfigurable regions; and
a static region including a controller operable to receive a plurality of reconfiguration bitstreams respectively corresponding to the reconfigurable regions, the reconfiguration bitstreams specifying formation of respective filters in the reconfigurable regions, being received from a source external to the query accelerator and routed to appropriate ones of the reconfigurable regions, and containing configuration information for implementing logical circuits using query accelerator resources,
each filter comprising
one or more registers for controlling and monitoring operation of the filter,
a memory for temporary storage in the filter,
filter logic,
an input stream interface for receiving data to be filtered,
a filtered output stream interface for providing a result of operation of the filter, and a plurality of partition pins having fixed physical locations and providing interfaces between the reconfigurable region of the filter and the static region, the partition pins comprising a configuration interface partition pin corresponding to a configuration interface for receiving at least one of the reconfiguration bitstreams, wherein the configuration interface partition pin is dedicated to receiving at least one of the reconfiguration bitstreams.

2. The query accelerator according to claim 1, wherein one or more of the filters further comprises a previous result stream interface for receiving results previously generated by another filter.

3. The query accelerator according to claim 1, wherein the controller is operable to receive the plurality of reconfiguration bitstreams by receiving respective reconfiguration bitstream addresses and acquires the reconfiguration bitstreams according to the reconfiguration bitstream addresses.

4. The query accelerator according to claim 1, further comprising a direct memory access (DMA) engine for at least one of moving data to the filters and moving data from the filters.

5. The query accelerator according to claim 1, wherein the reconfigurable regions and the static region are included in a field programable gate array (FPGA).

6. The query accelerator according to claim 1, wherein each reconfiguration bitstream specifies a filter type and one or more operand types.

7. A method for processing queries comprising:
splitting a query into sub-queries;
mapping the sub-queries to respective sets of filter properties;
mapping the sets of filter properties to respective reconfiguration bitstreams; and
configuring a plurality of filters within a field programable gate array (FPGA) according to respective ones of the respective reconfiguration bitstreams, wherein each filter is formed in a respective reconfigurable region of the FPGA, and wherein the reconfiguration bitstreams are received from a source external to the FPGA, routed to appropriate ones of the reconfigurable regions, and contains configuration information for implementing logical circuits using FPGA resources,
wherein each filter comprises a plurality of partition pins having fixed physical locations and providing interfaces between the reconfigurable region of the filter and a static region of the FPGA, and for each filter the partition pins comprise a configuration interface partition pin corresponding to a configuration interface for receiving at least one of the reconfiguration bitstreams, wherein the configuration interface partition pin is dedicated to receiving at least one of the reconfiguration bitstreams.

8. The method according to claim 7, wherein each reconfiguration bitstream specifies a filter type and one or more operand types.

9. The method according to claim 7, wherein each filter further comprises:
one or more registers for controlling and monitoring operation of the filter,
a memory for temporary storage in the filter,
filter logic,
an input stream interface for receiving data to be filtered, and
a filtered output stream interface for providing a result of operation of the filter.

10. The method according to claim 7, further comprising sending one or more control status register (CSR) values to a controller of the FPGA to initiate configuration of the filters.

11. The method according to claim 10, further comprising generating an accelerator generation recipe based on the mapping of the sub-queries and the mapping of the sets of filter properties, the recipe including reconfiguration bitstream addresses for respective ones of the reconfiguration bitstreams, wherein the sending of the CSR values to the controller is performed according to the accelerator generation recipe and comprises sending the reconfiguration bitstream addresses to the controller, and wherein the controller performs direct memory accesses to acquire the reconfiguration bitstreams according to the reconfiguration bitstream addresses.

12. The method according to claim 7, wherein the mapping the sub-queries comprises detecting whether the query requires string matching.

13. The method according to claim 12, wherein when there is a detection that the query requires string matching, the step of mapping the sets of filter properties to respective reconfiguration bitstreams comprises mapping at least one of the sets of filter properties to a reconfiguration bitstream for a string filter.

14. A system for processing queries comprising:
a driver for receiving a query and for controlling splitting the query into a plurality of sub-queries, mapping the sub-queries to respective sets of filter properties and mapping the sets of filter properties to respective reconfiguration bitstreams, generating an accelerator generation recipe based on the mapping of the sub-queries and the mapping of the sets of filter properties, and accessing one or more control status registers (CSRs) based on the accelerator generation recipe; and
a query accelerator comprising
a plurality of reconfigurable regions,
a static region including a controller operable to receive one or more control status register (CSR) values from the driver and acquire the plurality of reconfiguration bitstreams based on the received CSR values, the reconfiguration bitstreams respectively corresponding to the reconfigurable regions, and the reconfiguration bitstreams specifying formation of respective filters in the reconfigurable regions, being received from a source external to the query accelerator and routed to appropriate ones of the reconfigurable regions, and containing configuration information for implementing logical circuits using query accelerator resources,
each filter comprising
one or more registers for controlling and monitoring operation of the filter,
a memory for temporary storage in the filter,
filter logic,
an input stream interface for receiving data to be filtered,
a filtered output stream interface for providing a result of operation of the filter, and
a plurality of partition pins having fixed physical locations and providing interfaces between the reconfigurable region of the filter and the static region, the partition pins comprising a configuration interface partition pin corresponding to a configuration interface for receiving at least one of the reconfiguration bitstreams, wherein the configuration interface partition pin is dedicated to receiving at least one of the reconfiguration bitstreams.

15. The system according to claim 14, wherein one or more of the filters further comprises a previous result stream interface for receiving results previously generated by another filter.

16. The system according to claim 14, wherein the controller is operable to receive the plurality of reconfiguration bitstreams by receiving respective reconfiguration bitstream addresses and acquires the reconfiguration bitstreams according to the reconfiguration bitstream addresses.

17. The system according to claim 14, wherein the query accelerator further comprises a direct memory access (DMA) engine for at least one of moving data to the filters and moving data from the filters.

18. The system according to claim 14 wherein the reconfigurable regions and the static region are included in a field programable gate array (FPGA).

19. The system according to claim 14, wherein each reconfiguration bitstream specifies a filter type and one or more operand types.

20. The system according to claim 14, wherein the driver and query accelerator are included in a server.

* * * * *